(12) United States Patent
Molas et al.

(10) Patent No.: US 9,748,477 B2
(45) Date of Patent: Aug. 29, 2017

(54) METHOD OF FORMING A CONDUCTIVE FILAMENT IN A LIVING RESISTIVE MEMORY DEVICE INCLUDING A PRE-FORMING STEP TO FORM A LOCALISED PATH OF OXYGEN VACANCIES FROM AN INTERFACE LAYER

(71) Applicant: COMMISSARIAT A L'ENERGIE ATOMIQUE ET AUX ENERGIES ALTERNATIVES, Paris (FR)

(72) Inventors: Gabriel Molas, Grenoble (FR); Marinela Barci, Casalborgone (IT)

(73) Assignee: COMMISSARIAT À L'ÉNERGIE ATOMIQUE ET AUX ÉNERGIES ALTERNATIVES, Paris (FR)

( * ) Notice: Subject to any disclaimer, the term of this patent is extended or adjusted under 35 U.S.C. 154(b) by 0 days.

(21) Appl. No.: 14/884,328

(22) Filed: Oct. 15, 2015

(65) Prior Publication Data

US 2016/0111637 A1    Apr. 21, 2016

(30) Foreign Application Priority Data

Oct. 15, 2014 (FR) ..................... 14 59900

(51) Int. Cl.
  *G11C 13/00* (2006.01)
  *H01L 45/00* (2006.01)

(52) U.S. Cl.
  CPC .......... *H01L 45/08* (2013.01); *G11C 13/0011* (2013.01); *H01L 45/1233* (2013.01); *H01L 45/1253* (2013.01); *H01L 45/146* (2013.01); *H01L 45/1641* (2013.01); *G11C 2013/0083* (2013.01); *H01L 45/1266* (2013.01)

(58) Field of Classification Search
  None
  See application file for complete search history.

(56) References Cited

U.S. PATENT DOCUMENTS

| | | | |
|---|---|---|---|
| 2012/0168705 A1 | 7/2012 | Liu et al. | |
| 2014/0036570 A1* | 2/2014 | Lee | G11C 13/0004 365/148 |
| 2014/0269002 A1 | 9/2014 | Jo | |

OTHER PUBLICATIONS

French Search Report as issued in French Patent Application No. 1459900, dated Jun. 26, 2015.

* cited by examiner

*Primary Examiner* — Michael Jung
*Assistant Examiner* — Jay C Chang
(74) *Attorney, Agent, or Firm* — Pillsbury Winthrop Shaw Pittman LLP

(57) ABSTRACT

A resistive random access memory device includes a first electrode; a solid metal oxide electrolyte; and a second electrode, the first and second electrodes being respectively arranged on either side of the solid metal oxide electrolyte, the second electrode being capable of supplying mobile ions circulating in the solid metal oxide electrolyte to the first electrode to form a conductive filament between the first and second electrodes when a potential difference is applied between the first and second electrodes. The device further includes an interface layer including a metal oxide, the interface layer extending at least partially onto the first electrode, the solid metal oxide electrolyte extending at least partially onto the interface layer.

10 Claims, 4 Drawing Sheets

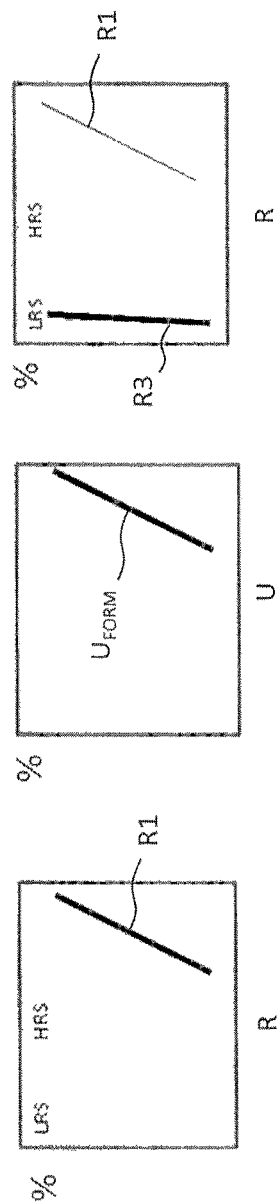
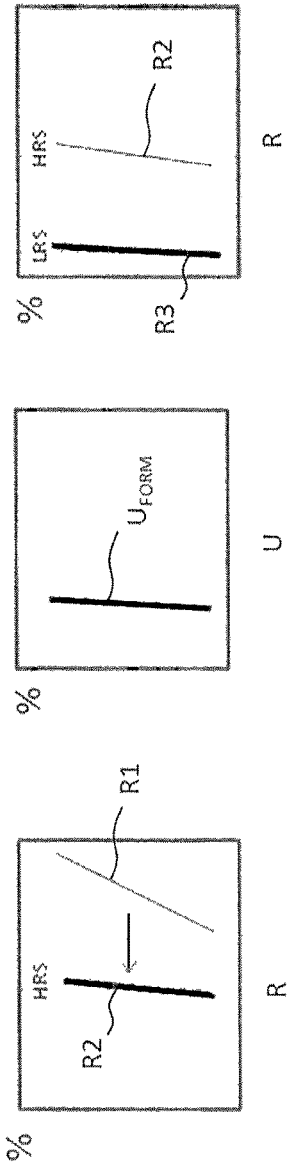

METHOD OF FORMING A CONDUCTIVE FILAMENT IN A LIVING RESISTIVE MEMORY DEVICE INCLUDING A PRE-FORMING STEP TO FORM A LOCALISED PATH OF OXYGEN VACANCIES FROM AN INTERFACE LAYER

CROSS REFERENCE TO RELATED APPLICATIONS

This application claims priority to French Patent Application No. 1459900, filed Oct. 15, 2014, the entire content of which is incorporated herein by reference in its entirety.

TECHNICAL FIELD OF THE INVENTION

The present invention relates to the field of rewritable non-volatile memories, and more specifically that of resistive random access memories. A resistive random access memory comprises first and second electrodes separated by a layer made of electrically insulating material, and passes from an insulating state to a conducting state by formation of a conductive filament between the first and second electrodes.

TECHNOLOGICAL BACKGROUND OF THE INVENTION

Resistive Random Access Memories (RRAM) are today the subject of great interest, particularly on account of their low electrical consumption and their high operating speed.

A resistive type memory cell has at least two states: a "High Resistance State" (HRS), also called "OFF" state, and a "Low Resistance State" (LRS) or "ON" state. It may thus be used to store binary information.

Three types of resistive memories may be distinguished: memories based on thermochemical mechanism, memories based on valence change, and memories based on electrochemical metallisation.

The field of the present invention more particularly relates to this latter category based on ion conduction materials (CBRAM or "Conductive Bridging RAM" memories). The operation resides in the reversible formation and rupture of a conductive filament in a solid electrolyte, through dissolution of a soluble electrode. These memories are promising due to their low programming voltages (of the order of a Volt), their short programming time (<1 μs), their low consumption and their low integration cost. Furthermore, these memories can be integrated into the metallisation levels of the logic of a circuit ("above IC"), which makes it possible to increase the integration density of the circuit. From the architectural viewpoint, they only require a selection device, a transistor or a diode for example.

The operation of CBRAM memories is based on the formation, within a solid electrolyte, of one or more metal filaments (also called "dendrites") between two electrodes, when said electrodes are taken to suitable potentials. The formation of the filament makes it possible to obtain a given electrical conduction between the two electrodes. By modifying the potentials applied to the electrodes, it is possible to modify the distribution of the filament, and thus to modify the electrical conduction between the two electrodes. For example, by reversing the potential between the electrodes, it is possible to make disappear or reduce the conductive filament, so as to eliminate or reduce considerably the electrical conduction due to the presence of the filament.

FIGS. 1a, 1b and 1c schematically illustrate the operation of a CBRAM type memory device 1. The memory device 1 is formed by a stack of Metal/Ion conductor/Metal type. It comprises a solid electrolyte 2, for example based on doped chalcogenide (e.g. GeS) or oxide (e.g. $Al_2O_3$). The electrolyte 2 is arranged between a lower electrode 3, for example made of Pt, forming an inert cathode, and an upper electrode 4 comprising a portion of ionisable metal, for example copper, and forming a soluble anode. A portion of ionisable metal is a portion of metal able to form metal ions, for example $Cu^{2+}$ ions in the case where the ionisable metal is copper, when it is subjected to a suitable electrical potential. The memory device 1 represented in FIGS. 1a, 1b and 1c typically forms a memory point, that is to say a unit memory cell, of a memory comprising a multitude of these memory devices.

FIG. 1a schematically illustrates the memory device 1 in the virgin state, before the first use of said memory device 1, that is to say before the first application of a potential difference between the soluble electrode 4 and the inert electrode 3 for the passage of the memory device 1 to the "ON" state. FIG. 1b schematically illustrates the memory device 1 in the "ON" state. FIG. 1c schematically illustrates the memory device 1 in the "OFF" state.

The first use of the memory device 1 makes it possible to pass from the virgin state to the "ON" state, thanks to the carrying out of a step called "forming". The step of passing from the "ON" state to the "OFF" state is called "RESET", whereas the step of passing from the "OFF" state to the "ON" state is called "SET".

When a potential difference is applied between the soluble electrode 4 and the inert electrode 3, the electrical potential applied to the soluble electrode 4 being greater than the electrical potential applied to the inert electrode 3, an oxidation-reduction reaction takes place at the soluble electrode 4, creating mobile ions. In the case of a soluble copper electrode 4, the following reaction takes place:

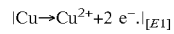

$$|Cu \rightarrow Cu^{2+} + 2\ e^-.|_{[E1]}$$

The mobile ions then move in the electrolyte 2 under the effect of the potential difference applied between the electrodes. The speed of movement depends on the mobility of the ion in the electrolyte in question, which guides the choice of the soluble electrode/electrolyte pairing (examples: Ag/GeS; $Cu/Al_2O_3$, etc.). The speeds of movement of the ions are of the order of nm/ns. On arrival at the inert electrode 3, the mobile ions are reduced due to the presence of electrons supplied by the electrode 3, leading to the growth of a conductive filament 5 according to the following reaction:

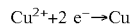

$$Cu^{2+} + 2\ e^- \rightarrow Cu$$

The conductive filament 5 grows preferentially in the direction of the soluble electrode 4. The memory device 1 passes to the "ON" state when the filament 6 enables contact between the electrodes 3 and 4, making the stack conductive. FIG. 1b schematically illustrates the memory device 1 in the "ON" state.

A potential difference applied between the soluble electrode 4 and the inert electrode 3, the electrical potential applied to the soluble electrode 4 being less than the electrical potential applied to the inert electrode 3, instead leads to the dissolution of the conductive filament 5. To justify this dissolution, thermal mechanisms (heating) and oxidation-reduction mechanisms are generally invoked. The memory device 1 then passes to the "OFF" state. Often, the electrolyte 2 contains in the "OFF" state a residual filament 6, which is in contact with the cathode 3 but which is not in contact with the anode 4. The residual filament 6 stems from an incomplete dissolution of the conductive filament 5. A filament is called residual when it does not establish a sufficient electrical conduction between the electrodes to obtain the "ON" state. FIG. 1c schematically illustrates the memory device 1 in the "OFF" state.

During the first use of the memory device 1, that is to say during the first application of a potential difference between the soluble electrode 4 and the inert electrode 3, the conductive filament 6 is generated for the first time: it is the forming step mentioned previously, which makes is possible to pass from the "virgin" state to the "ON" state. The potential difference required to carry out this first forming step is typically greater than the potential difference required thereafter during SET steps. Furthermore, the potential difference necessary to carry out the forming step can vary from one memory device to the next. In a memory array comprising a plurality of memory devices, there thus exists typically a distribution, a dispersion of the potential difference to apply to each memory device, for the first formation of the conductive filament within each memory device. This dispersion is explained in particular by the fact that the potential difference required to carry out the first forming step is a function of the initial resistance value, noted R0, of the memory device 1 in the virgin state. In a memory array comprising a plurality of memory devices, the distribution of the initial resistance value R0 typically attains several decades. During the forming step, it is nevertheless very important to apply to each memory device a potential difference which is adjusted to it. In fact, the application of a potential difference less than the nominal potential difference does not enable the first formation of the conductive filament. Instead, the application of a potential difference greater than the nominal potential difference leads to a degradation of the electrical performances of the memory device, particularly in terms of reliability, retention and endurance.

In order to avoid the application of a too great potential difference to a memory device during the forming step, a solution consists in carrying out successively several forming cycles with increasing potential differences. The state of the memory device is read after each cycle in order to determine its state, that is to say in order to know whether the conductive filament is formed or not. If the conductive filament is not formed, the following cycle is carried out. If the conductive filament is formed, the process is stopped for the memory device considered. Such a solution nevertheless implies a long forming time, particularly in the case of a memory array comprising a plurality of memory devices, the potential difference to apply to each memory device having to be adjusted for each of said memory devices.

SUMMARY OF THE INVENTION

In this context, an objective of the invention is to propose a metal oxide based CBRAM memory device making it possible to accelerate the forming step while preserving the electrical performances of said memory device.

Another objective of the invention is to propose a metal oxide based CBRAM memory device making it possible to accelerate the forming step while improving the electrical performances of said memory device.

Another objective of the invention is to propose a method of first formation of the conductive filament in a metal oxide based CBRAM memory device making it possible to accelerate the forming step while preserving the electrical performances of said memory device.

Another objective of the invention is to propose a method of first formation of the conductive filament in a metal oxide based CBRAM memory device making it possible to accelerate the forming step while improving the electrical performances of said memory device.

An aspect of the invention thus relates to a resistive random access memory device comprising:
- a first electrode, called "inert electrode";
- a solid metal oxide electrolyte;
- a second electrode, called "soluble electrode", the first and second electrodes being respectively arranged on either side of said solid metal oxide electrolyte, the second electrode being capable of supplying mobile ions circulating in the solid metal oxide electrolyte to the first electrode to form a conductive filament between the first and second electrodes when a potential difference is applied between the first and second electrodes;

said device comprising an interface layer including a metal oxide, the interface layer extending at least partially onto the first electrode, the solid metal oxide electrolyte extending at least partially onto the interface layer.

Thanks to the invention, the interface layer including a metal oxide advantageously behaves like a source of oxygen vacancies for the solid metal oxide electrolyte, having a tendency to attract, or pump, one or more oxygen elements from the solid metal oxide electrolyte which extends at least partially onto said interface layer. The interface layer advantageously enables the generation of a localised path of oxygen vacancies within the solid metal oxide electrolyte, between the soluble electrode and the inert electrode.

Apart from the characteristics that have been evoked in the previous paragraph, the resistive random access memory device according to an aspect of the invention may have one or more additional characteristics among the following, considered individually or according to any technically possible combinations thereof:
- The metal oxide of the interface layer is a sub-stoichiometric metal oxide of formula $MO_x$, with M a metal, O oxygen and $1<x<2$.
- The metal oxide of the interface layer is a sub-stoichiometric metal oxide of formula $MO_x$, with M a metal, O oxygen and $1.6<x<1.9$.
- The metal oxide of the interface layer is a metal oxide of a transition metal of groups 3, 4, 5 or 6 of the periodic table of elements.
- The transition metal of groups 3, 4, 5 or 6 of the periodic table of elements is titanium Ti. Alternatively, the transition metal of groups 3, 4, 5 or 6 of the periodic table of elements is hafnium Hf or zirconium Zr.
- The interface layer extending along a reference plane, the interface layer has a thickness comprised between 0.5 nm and 2 nm, said thickness being measured along a direction substantially perpendicular to said reference plane.

Another aspect of the invention relates to a method of first formation of the conductive filament in a resistive random access memory device according to any of the preceding claims, the method comprising:
- a step called "pre-forming" according to which, the resistive random access memory device being in a first insulating state and having a first resistance R1, a first electrical potential V1 is applied to the first electrode and a second electrical potential V2 is applied to the second electrode, the second electrical potential V2 being less than the first electrical potential V1, for the formation of a localised path of oxygen vacancies between the first and second electrodes, the resistive random access memory device at the end of said pre-forming step being in a second insulating state and having a second resistance R2 less than the first resistance R1;

a step called "forming" according to which, the resistive random access memory device being in the second insulating state, a first electrical potential V1' is applied to the first electrode and a second electrical potential V2' is applied to the second electrode, the second electrical potential V2' being greater than the first electrical potential V1', for the formation of the conductive filament between the first and second electrodes, the resistive random access memory device at the end of said forming step being in a conducting state.

Apart from the characteristics which have been evoked in the preceding paragraph, the method of first formation of the conductive filament according to an aspect of the invention may have one or more additional characteristics among the following, considered individually or according to any technically possible combinations thereof:

During the pre-forming step, the value of the first electrical potential V1 which is applied to the first electrode and the value of the second potential V2 which is applied to the second electrode are chosen such that the ratio R1/R2 of the first resistance R1 over the second resistance R2 is of the order of $10^3$.

Another aspect of the invention relates to a method of programming a memory array comprising a plurality of resistive random access memory devices according to an aspect of the invention, said method comprising, for each resistive random access memory device of the memory array, a step of implementation of the method of first formation of the conductive filament according to an aspect of the invention.

Apart from the characteristics which have been evoked in the previous paragraph, the method of programming a memory array comprising a plurality of resistive random access memory devices according to an aspect of the invention may have one or more of the additional characteristics among the following, considered individually or according to any technically possible combinations thereof:

During each step of pre-forming each resistive random access memory device of the memory array, the first electrical potential V1 and the second electrical potential V2 are specific to each resistive random access memory device, and during each step of forming each resistive random access memory device of the memory array, the first electrical potential V1' and the second electrical potential V2' are specific to each resistive random access memory device.

Alternatively, the method comprises a step called "general pre-forming" according to which, the memory array being in a first average insulating state and having a first average resistance, a same first electrical potential is applied to the first electrode and a same second electrical potential is applied to the second electrode of each resistive random access memory device of the memory array for the formation of a localised path of oxygen vacancies between the first and second electrodes of each resistive random access memory device of the memory array, the memory array at the end of said general pre-forming step being in a second average insulating state and having a second average resistance less than the first average resistance.

The invention and its different applications will be better understood on reading the description which follows and by examining the figures which accompany it.

BRIEF DESCRIPTION OF THE DRAWINGS

The figures are presented for indicative purposes and in no way limit the invention.

FIG. 4a is a graph showing, for a plurality of CBRAM type memory devices according to the prior art, the distribution of the resistance values before the forming step.

FIG. 4b is a graph showing, for a plurality of CBRAM type memory devices according to the prior art, the distribution of the potential difference values required to carry out the forming step.

FIG. 4c is a graph showing, for a plurality of CBRAM type memory devices according to the prior art, the distribution of the resistance values at the end of the forming step.

FIG. 5a is a graph showing, for a plurality of CBRAM memory devices according to an aspect of the invention, the distribution of the resistance values before the pre-forming step.

FIG. 5b is a graph showing, for a plurality of metal oxide based CBRAM memory devices according to an aspect of the invention, the distribution of the resistance values at the end of the pre-forming step.

FIG. 5c is a graph showing, for a plurality of metal oxide based CBRAM memory devices according to an aspect of the invention, the distribution of the potential difference values required to carry out the forming step, the pre-forming step having been carried out.

FIG. 5d is a graph showing, for a plurality of metal oxide based CBRAM memory devices according to an aspect of the invention, the distribution of the resistance values at the end of the forming step, the pre-forming step having been carried out.

DETAILED DESCRIPTION OF AT LEAST ONE EMBODIMENT OF THE INVENTION

Unless stated otherwise, a same element appearing in the different figures has a single reference.

In the present description, the expressions "CBRAM memory cell", "CBRAM type memory device" and "resistive random access memory device" will be employed indiscriminately.

Figure 1A:
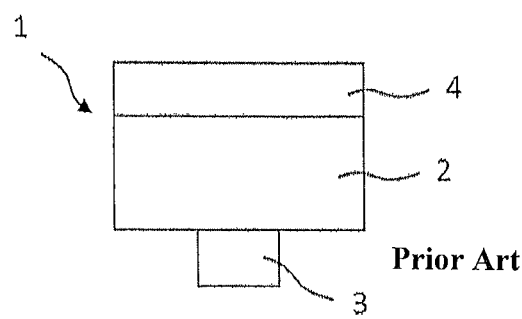
FIG. 1a schematically illustrates a CBRAM type memory device according to the prior art, in a "virgin" state.
Figure 1B:
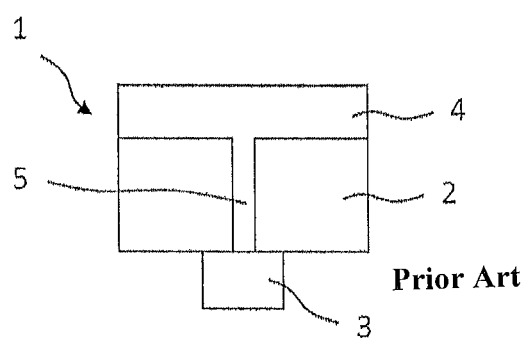
FIG. 1b schematically illustrates a CBRAM type memory device according to the prior art, in an "ON" state.
Figure 1C:
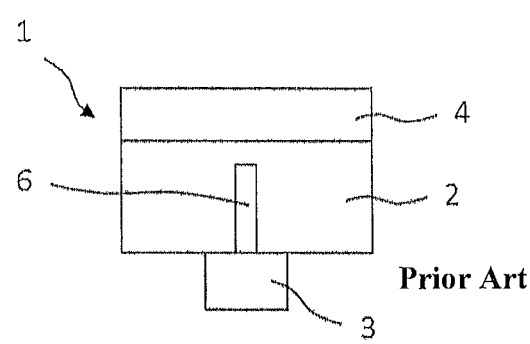
FIG. 1c schematically illustrates a CBRAM type memory device according to the prior art, in an "OFF" state.

FIGS. 1a, 1b and 1c, which schematically illustrate a CBRAM type memory device 1 according to the prior art, have been described previously.

Figure 2:
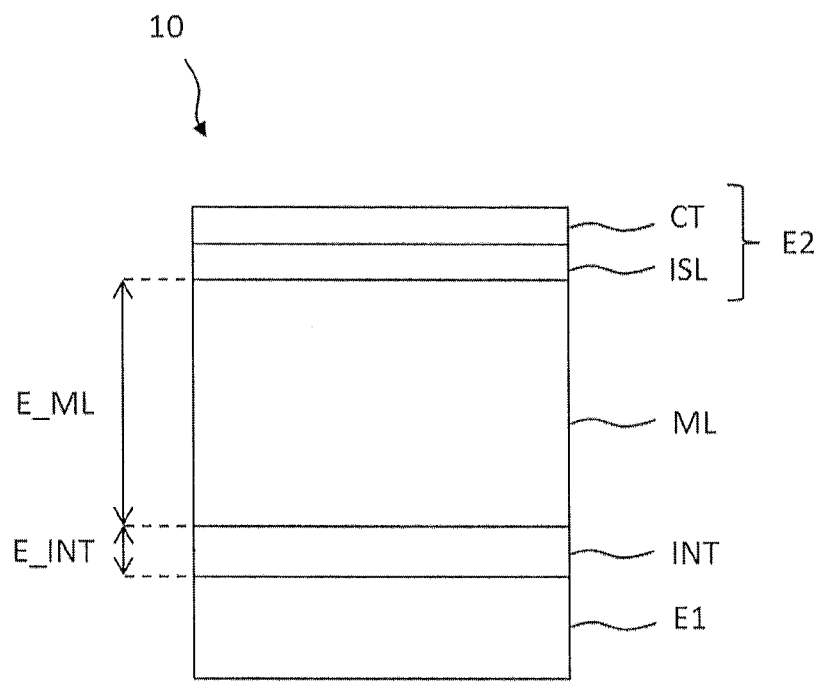
FIG. 2 schematically illustrates a metal oxide based CBRAM type memory device according to an aspect of the invention, in a first insulating state.

FIG. 2 schematically illustrates a memory device 10 of metal oxide based CBRAM type according to an aspect of the invention, in a first insulating state. The memory device 10 according to an aspect of the invention comprises:
- a first electrode E1, also called "inert electrode" or "cathode", extending along a reference plane;
- an interface layer INT extending at least partially onto the first electrode E1, parallel to the reference plane;
- a solid metal oxide electrolyte ML, extending over the interface layer INT, parallel to the reference plane;
- a second electrode E2, also called "soluble electrode" or "anode", extending over the solid metal oxide electrolyte ML, parallel to the reference plane.

The second electrode E2 includes preferentially:
- a first layer ISL, called "ion source layer" made from a soluble conductive element and extending over the solid metal oxide electrolyte ML;
- a second layer CT, called "electrical contact layer", made from a conductor material and extending at least partially onto the ion source layer ISL.

The memory device 10 in the first insulating state has a first resistance R1. The first insulating state is the state of the memory device 10 before the first formation of a conductive filament within said memory device 10.

The first electrode E1 is made of an inert conductor material, that is to say not participating in the formation of a conductive filament within the solid metal oxide electrolyte ML. This inert conductor material may typically be:
- ruthenium Ru,
- ruthenium oxide $RuO_2$,
- tungsten W,
- tungsten nitride $WN_x$,
- tantalum nitride TaN,
- titanium nitride TiN, or any alloy or combination of elements which have just been cited.

According to an alternative not represented in FIG. 2, the first electrode E1 may have a pad shape. According to this alternative, the interface layer INT extends partially over the first electrode E1.

The interface layer INT is a source of oxygen vacancies including a metal oxide. "Oxygen vacancy source" is taken to mean the fact that the interface layer INT has a tendency to attract, or pump, one or more oxygen elements from the solid metal oxide electrolyte ML. When the interface layer INT takes an oxygen element from the solid metal oxide electrolyte ML, there is creation of an oxygen vacancy in the solid metal oxide electrolyte ML.

The metal oxide of the interface layer INT is preferentially a sub-stoichiometric metal oxide of formula $MO_x$, with M a metal, O oxygen and $1<x<2$. In particular, the metal oxide of the interface layer INT is preferentially a sub-stoichiometric oxide of formula $MO_x$ with M the metal, O oxygen and $1.6<x<1.9$.

The metal oxide of the interface layer INT is preferentially a metal oxide of a transition metal of the periodic table of elements. In particular, the metal oxide of the interface layer INT is preferentially a metal oxide of a transition metal of groups 3, 4, 5 or 6 of the periodic table of elements.

Thus, the metal oxide of the interface layer INT may in particular be a titanium oxide, a hafnium oxide or a zirconium oxide. Alternatively, the metal oxide of the interface layer INT may also be an aluminium oxide.

The interface layer INT typically has a thickness E_INT, measured along a direction perpendicular to the reference plane, comprised between 0.5 nm and 2 nm.

In the particular example represented in FIG. 2, the solid metal oxide electrolyte ML is made of gadolinium oxide $Gd_2O_3$. In particular, the solid metal oxide electrolyte ML may be made of hybrid gadolinium oxide $Gd_2O_3$, that is to say comprising at least one first sub-layer made of gadolinium oxide $Gd_2O_3$ and a second sub-layer made of gadolinium oxide $Gd_2O_3$. The first sub-layer is a standard sub-layer formed by RF sputtering using argon Ar, xenon Xe or krypton Kr gas. The second sub-layer is a layer made of sub-stoichiometric gadolinium oxide $Gd_2O_3$, obtained from a gadolinium Gd target in reactive deposition under oxygen. Said first and second sub-layers are, at least partially, directly in contact with each other, and said first and second sub-layers are typically substantially of same thickness.

Alternatively, the following configurations, considered individually or according to any technically possible combinations thereof, could be adopted:
- the solid metal oxide electrolyte ML is made of aluminium oxide $Al_2O_3$, zirconium dioxide $ZrO_2$, titanium dioxide $TiO_2$ or tantalum oxide $Ta_2O_5$;
- the solid metal oxide electrolyte ML comprises at least one bi-layer of type $Gd_2O_3/Al_2O_3$, $Gd_2O_3/GeO$, $Gd_2O_3/La_2O_3$, $Gd_2O_3/Li_2O$, $Gd_2O_3/B_2O_3$, $Gd_2O_3/WO_2$, $Gd_2O_3/VO_2$, $Gd_2O_3/V_2O_5$, $Gd_2O_3/MgO$ or $Gd_2O_3/MgAl_2O_4$;
- the solid metal oxide electrolyte ML comprises at least one tri-layer of type $Gd_2O_3/Al_2O_3/Gd_2O_3$, $Gd_2O_3/GeO/Gd_2O_3$, $Gd_2O_3/La_2O_3/Gd_2O_3$, $Gd_2O_3/Li_2O/Gd_2O_3$, $Gd_2O_3/B_2O_3/Gd_2O_3$, $Gd_2O_3/WO_2/Gd_2O_3$, $Gd_2O_3/VO_2/Gd_2O_3$, $Gd_2O_3/V_2O_5/Gd_2O_3$, $Gd_2O_3/MgO/Gd_2O_3$, $Gd_2O_3/MgAl_2O_4/Gd_2O_3$.

The solid metal oxide electrolyte ML typically has a thickness E_ML, measured along a direction perpendicular to the reference plane, of the order of several nanometres. The thickness E_ML of the solid electrolyte ML is typically chosen such that the first resistance R1 of the memory device 10 in the first insulating state is greater than or equal to $10^9$ ohms.

The ion source layer ISL of the second electrode E2 is made of a soluble conductor material, that is to say participating in the formation of a conductive filament within the solid metal oxide electrolyte ML. This soluble conductor material may be for example:
- copper Cu;
- an alloy of copper Cu with a chalcogen element such as tellurium Te;
- zinc Zn;
- silver Ag;
- copper nitride $Cu_3N$;
- zinc nitride $Zn_3N_2$;
- silver nitride $Ag_3N$.

The electrical contact layer CT of the second electrode E2 is made from a conductor material, such as for example Ti—TiN, that is to say a layer of Ti and a layer of TiN, or Ta—TaN, that is to say a layer of Ta and a layer of TaN.

Figure 3A:
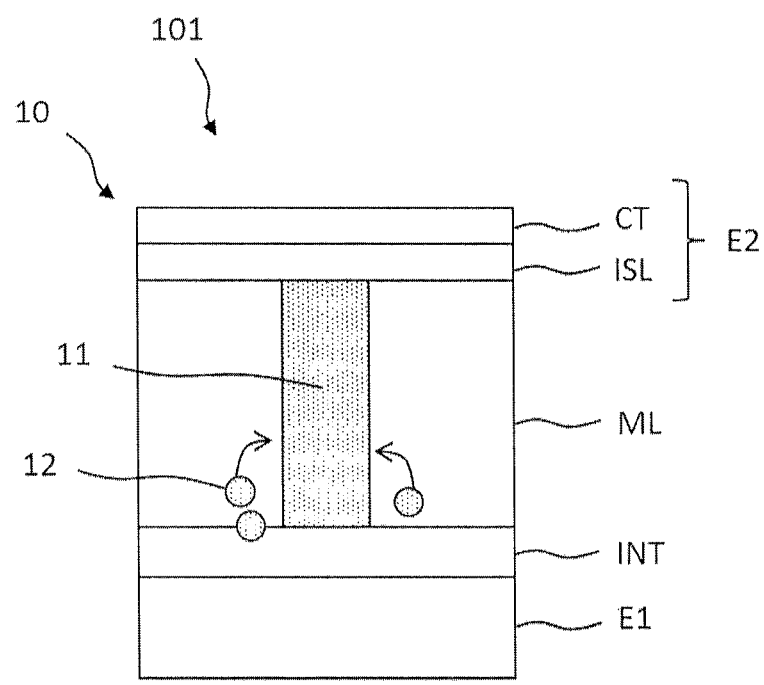
FIG. 3a schematically illustrates a step, called "pre-forming", of a method of first formation of a conductive filament in the metal oxide based CBRAM memory device of FIG. 2.
Figure 3B:
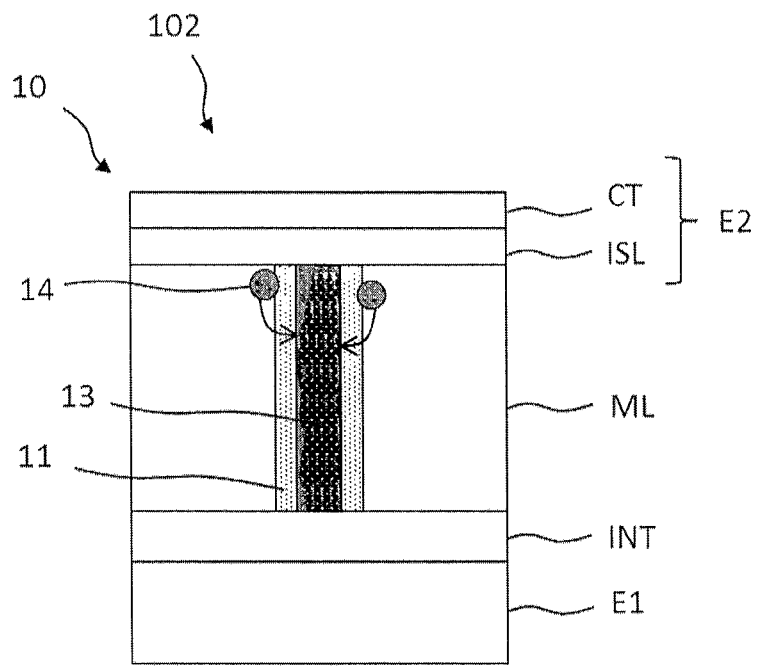
FIG. 3b schematically illustrates a step, called "forming", of the method of first formation of a conductive filament in the metal oxide based CBRAM memory device of FIG. 2.

FIGS. 3a and 3b schematically illustrate the steps of a method of first formation of a conductive filament in the memory device 10 according to an aspect of the invention.

FIG. 3a schematically illustrates a step 101, called "pre-forming". Before the pre-forming step 101, the memory device 10 is in the first insulating state and has the first resistance R1, as described previously. During the pre-forming step 101, a first electrical potential V1 is applied to the first electrode E1 and a second electrical potential V2 is applied to the second electrode E2, the second electrical potential V2 being less than the first electrical potential V1, for the formation of a localised path 11 of oxygen vacancies 12. It may be noted that in the case where the first electrical potential V1 is zero, the second electrical potential V2 is negative. At the end of the pre-forming step 101, the memory device 10 is in a second insulating state and has a second resistance R2 which is less than the first resistance R1. The second insulating state is also called "OFF" state, or "HRS" state (High Resistive State). The potential difference which is applied to the memory device 10 during the pre-forming step 101 is advantageously chosen such that the ratio R1/R2 of the first resistance R1 over the second resistance R2 is of the order of $10^3$. Thus, in the case where the first resistance R1 is of the order of $10^9$ ohms, the potential difference which is applied to the memory device 10 during the pre-forming step 101 is advantageously chosen such that the second resistance R2 is of the order of $10^6$ ohms.

FIG. 3b schematically illustrates a step 102, called "forming". Before the forming step 102, the memory device 10 is in the second insulating state and has the second resistance R2. During the forming step 102, a first electrical potential V1' is applied to the first electrode E1 and a second electrical potential V2' is applied to the second electrode E2, the second electrical potential V2' being greater than the first electrical potential V1', for the formation of a conductive filament 13. The conductive filament 13 is formed from mobile ions 14. The mobile ions 14 are created at the level of the soluble electrode E2 by an oxidation-reduction reaction, then move in the solid electrolyte ML under the effect of the potential difference applied between the electrodes, before being reduced at the level of the inert electrode E1, leading to the growth of the conductive filament 13 between the inert electrode E1 and the soluble electrode E2. It may be noted that in the case where the first electrical potential V1' is zero, the second electrical potential V2' is positive. At the end of the forming step 102, the memory device 10 is in a conducting state and has a third resistance R3 which is less than the first and second resistances R1 and R2. The third resistance R3 is typically of the order of $10^3$ ohms. The conducting state is also called "ON" state or "LRS" state (Low Resistive State), Generally speaking, the lower the resistance value of a memory device, the lower the potential difference $U_{FORM}$= (V2'–V1') required to carry out the forming step 102. When the resistance of a given memory device is sufficiently low, a very interesting case may be attained for which the potential difference $U_{FORM}$ required to carry out the forming step 102 is equal to the potential difference $U_{SET}$ required to carry out a SET step, as described previously. This type of operation is also called "free forming": the forming potential difference, during the first formation of the conductive filament, is equal to the SET potential difference, during later formations of the conductive filament. The method according to the invention of first formation of a conductive filament within a memory device 10 advantageously makes it possible, thanks to the pre-forming step 101, to lower the resistance value of said memory device 10, while passing from the first resistance R1 to the second resistance R2, while conserving the memory device 10 in an insulating state. The method according to the invention of first formation of a conductive filament within a memory device 10 also makes it possible, thanks to the pre-forming step 101, to control the value of the second resistance R2, and thus to contribute to controlling the value of the potential difference $U_{FORM}$ required to carry out the forming step 102. Thus, in the case of a memory array comprising a plurality of memory devices 10 according to an aspect of the invention, advantageously the dispersion of the values of potential difference $U_{FORM}$ required to carry out the forming step 102 is reduced.

Figure 3C:
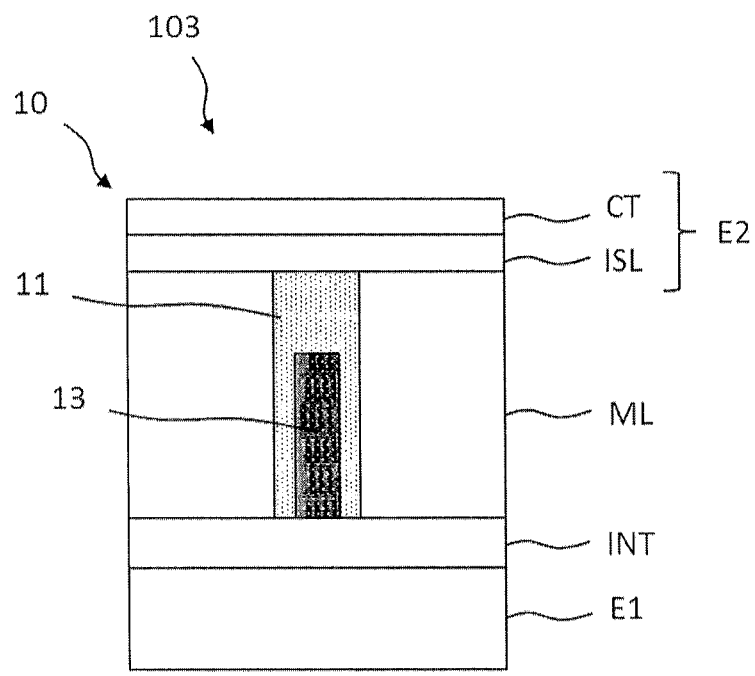
FIG. 3c schematically illustrates a step, called "RESET", of a method of using the metal oxide based CBRAM memory device of FIG. 2.

FIG. 3c schematically illustrates a step 103, called "RESET", of a method of using the memory device 10 according to an aspect of the invention. Said method of using advantageously comprises the pre-forming step 101, the forming step 102 and the RESET step 103. Before the RESET step 103, the memory device 10 is in the conducting state, that is to say in the LRS or "ON" state, thanks to the conductive filament 13 between the inert electrode E1 and the soluble electrode E2. During the RESET step 103, a first electrical potential V1" is applied to the first electrode E1 and a second electrical potential V2" is applied to the second electrode E2, the second electrical potential V2" being less than the first electrical potential V1", for the at least partial dissolution of the conductive filament 13. It may be noted that in the case where the first electrical potential V1" is zero, the second electrical potential V2" is negative. At the end of the RESET step 103, the memory device 10 is in the second insulating state, that is to say in the HRS or "OFF" state. At the end of the RESET step 103, the conductive filament 13 may be completely dissolved: in this case, the memory device 10 has the second resistance R2. At the end of the RESET step 103, the filament 13 may alternatively be partially dissolved: in this case, the memory device 10 typically has a resistance which is a little less than the second resistance R2, while being of the order of the second resistance R2. Generally speaking, at the end of the RESET step 103, the memory device 10 is in an insulating state with a resistance less than the first resistance R1 of the first insulating state. It may be noted that the localised path 11 of oxygen vacancies 12 is not dissolved during the RESET step 103. Once formed in the memory device 10 thanks to the pre-forming step 101, the localised path 11 of oxygen vacancies 12 permanently remains in the memory device 10 used under normal conditions of use. "Localised path 11 of oxygen vacancies 12 permanently remains in the memory device 10" is taken to mean the fact that, from one memory cycle to the next, said localised path 11 of oxygen vacancies 12 is little or not modified: it is possible that the concentration of oxygen vacancies 12 of the localised path 11 varies substantially during different "ON"/"OFF" cycles of the memory device 10. "Normal conditions of use" is taken to mean the conditions making it possible to make the memory device 10 pass from its "ON" state to its "OFF" state, thanks to the RESET step which has just been described, as well as from its "OFF" state to its "ON" state, thanks to a step called "SET" which is at present described.

The method of using the memory device 10 according to an aspect of the invention may then typically comprise a SET step, not represented. Before the SET step, the memory device 10 is in the second insulating state, that is to say in the HRS or "OFF" state. Before the SET step, the memory device 10 thus comprises the localised path 11 of oxygen vacancies 12 between the soluble electrode E2 and the inert electrode E1, whereas the conductive filament 13 is partially or completely dissolved. As described previously:

in the case where the conductive filament 13 is completely dissolved, the memory device 10 typically has the second resistance R2, whereas in the case where the conductive filament 13 is partially dissolved, the memory device 10 typically has a resistance less than the second resistance R2, while being of the order of the second resistance R2.

During the SET step, a first electrical potential V1''' is applied to the first electrode E1 and a second electrical potential V2''' is applied to the second electrode E2, the second electrical potential V2''' being greater than the first electrical potential V1''', in order to reform completely the conductive filament 13 between the inert electrode E1 and the soluble electrode E2. It may be noted that in the case where the first electrical potential V1''' is zero, the second electrical potential V2''' is positive. At the end of the SET step, the memory device 10 is in the conducting state, that is to say in the LRS or "ON" state, and has the third resistance R3. It may be noted that the potential difference $U_{SET}=(V2'''-V1''')$ which is applied to the memory device 10 during the SET step is less than or equal to the potential difference $U_{FORM}=(V2'-V1')$ which is applied to the memory device 10 during the forming step 102. In the case where the memory device 10 has, before the SET step, the second resistance R2, that is to say in the case where the conductive filament 13 has been completely dissolved during the preceding RESET step 103, then typically: $U_{FORM}=U_{SET}$. In the case where the memory device 10 has, before the SET step, a resistance less than the second resistance R2, that is to say in the case where the conductive filament 13 has been partially dissolved during the preceding RESET step 103, then typically $U_{SET}<U_{FORM}$.

FIG. 4a is a graph showing, for a first plurality of memory devices according to the prior art, the distribution of the values of first resistance R1 before the first formation of a conductive filament within each of said memory devices according to the prior art, that is to say before the forming step.

FIG. 4b is a graph showing, for the first plurality of memory devices according to the prior art, the distribution of the differences of potential $U_{FORM}$ required to carry out the forming step.

FIG. 4c is a graph showing, for the first plurality of memory devices according to the prior art, the distribution of the values of third resistance R3 at the end of the forming step. FIG. 4c shows a first difference ec1 between the straight line of the values of first resistance R1 and the straight line of the values of third resistance R3, for the first plurality of memory devices according to the prior art.

FIG. 5a is a graph showing, for a second plurality of memory devices 10 according to an aspect of the invention, the distribution of the values of first resistance R1 before the first formation of a conductive filament within each of said memory devices 10 according to an aspect of the invention, that is to say before the pre-forming step 101. It may be noted that said distribution of the values of first resistance R1 for the second plurality is substantially identical to the distribution of the values of first resistance R1 for the first plurality.

FIG. 5b is a graph showing, for the second plurality of memory devices 10 according to an aspect of the invention, the distribution of the values of second resistance R2 at the end of the pre-forming step. FIG. 5b shows:
  on the one hand, that the values of second resistance R2 are less than the values of first resistance R1, which is reflected in the graph 5b by the fact that the straight line of the values of second resistance R2 is shifted towards the left compared to the straight line of the values of first resistance R1;
  and on the other hand, that the dispersion of the values of second resistance R2 is less than the dispersion of the values of first resistance R1, which is reflected in the graph 5b by the fact that the straight line of the values of second resistance R2 has a slope steeper than the slope of the straight line of the values of first resistance R1.

FIG. 5c is a graph showing, for the second plurality of memory devices 10 according to an aspect of the invention, the distribution of the differences of potential $U_{FORM}$ required to carry out the forming step 102, the pre-forming step 101 having been carried out. It may be noted that:
  on the one hand, the values of difference of potential $U_{FORM}$ for the second plurality are less than the values of difference of potential $U_{FORM}$ for the first plurality, which is reflected by the fact that the straight line of the values of difference of potential $U_{FORM}$ for the second plurality, represented in FIG. 5c, is shifted towards the left compared to the straight line of the values of difference of potential $U_{FORM}$ for the first plurality, represented in FIG. 4b;
  and on the other hand, the dispersion of the values of difference of potential $U_{FORM}$ for the second plurality is less than the dispersion of the values of difference of potential $U_{FORM}$ for the first plurality, which is reflected by the fact that the straight line of the values of difference of potential $U_{FORM}$ for the second plurality, represented in FIG. 5c, has a slope steeper than the slope of the straight line of the values of difference of potential $U_{FORM}$ for the first plurality, represented in FIG. 4b.

FIG. 5d is a graph showing, for the second plurality of memory devices 10 according to an aspect of the invention, the distribution of the values of third resistance R3 at the end of the forming step 102, the pre-forming step 101 having been carried out. Said distribution of the values of third resistance R3 for the second plurality is substantially identical to the distribution of the values of third resistance R3 for the first plurality.

The invention claimed is:
1. A method of first formation of a conductive filament in a resistive random access memory device, the resistive random access memory device comprising:
  a first electrode;
  a solid metal oxide electrolyte;
  a second electrode, the first and second electrodes being respectively arranged on either side of said solid metal oxide electrolyte, the second electrode being capable of supplying mobile ions circulating in the solid metal oxide electrolyte to the first electrode to form a conductive filament between the first and second electrodes when a potential difference is applied between the first and second electrodes;
  an interface layer including a metal oxide, the interface layer extending at least partially onto the first electrode, the solid metal oxide electrolyte extending at least partially onto the interface layer;
  the method comprising:
  performing a pre-forming step according to which, the resistive random access memory device being in a first insulating state and having a first resistance, a first electrical potential of the pre-forming step is applied to the first electrode and a second electrical potential of the pre-forming step is applied to the second electrode, the second electrical potential of the pre-forming less than the first electrical potential of the pre-forming step, for the formation of a localised path of oxygen vacancies between the first and second electrodes, the resistive random access memory device at the end of said pre-forming step being in a second insulating state and having a second resistance less than the first resistance;

performing a forming step according to which, the resistive random access memory device being in the second insulating state, a first electrical potential of the forming step is applied to the first electrode and a second electrical potential of the forming step is applied to the second electrode, the second electrical potential of the forming step being greater than the first electrical potential of the forming step, for the formation of the conductive filament between the first and second electrodes, the resistive random access memory device at the end of said forming step being in a conducting state.

2. The method according to claim 1, wherein the metal oxide of the interface layer is a sub-stoichiometric metal oxide of formula $MO_x$, with M is a metal, O is oxygen and $1 < x < 2$.

3. The method according to claim 2, wherein $1.6 < x < 1.9$.

4. The method according to claim 1, wherein the metal oxide of the interface layer is a metal oxide of a transition metal of groups 3, 4, 5 or 6 of the periodic table of elements.

5. The method according to claim 4, wherein the transition metal of groups 3, 4, 5 or 6 of the periodic table of elements is titanium Ti, hafnium Hf or zirconium Zr.

6. The method according to claim 1, wherein the interface layer extends along a reference plane, and wherein the interface layer has a thickness comprised between 0.5 nm and 2 nm, said thickness being measured along a direction substantially perpendicular to said reference plane.

7. The method according to claim 1, wherein during the pre-forming step, a value of the first electrical potential of the pre-forming step which is applied to the first electrode and a value of the second potential of the pre-forming step which is applied to the second electrode are chosen so that a ratio of the first resistance over the second resistance is of the order of $10^3$.

8. A method for programming a memory array comprising a plurality of resistive random access memory devices, said method comprising, for each resistive random access memory device of the memory array, implementing the method of first formation of the conductive filament in a resistive random access memory device according to claim 1.

9. The method according to claim 8 wherein;

during each step pre-forming each resistive random access memory device of the memory array, the first electrical potential of the pre-forming step and the second electrical potential of the pre-forming step are specific to each resistive random access memory device;

during each step forming each resistive random access memory device of the memory array, the first electrical potential of the forming step and the second electrical potential of the forming step are specific to each resistive random access memory device.

10. The method according to claim 8, further comprising performing a general pre-forming step according to which, the memory array being in a first average insulating state and having a first average resistance, a same first electrical potential of the pre-forming step is applied to the first electrode and a same second electrical potential of the pre-forming step is applied to the second electrode of each resistive random access memory device of the memory array for the formation of a localised path of oxygen vacancies between the first and second electrodes of each resistive random access memory device of the memory array, the memory array at the end of said general pre-forming step being in a second average insulating state and having a second average resistance less than the first average resistance.

* * * * *